United States Patent
Hansen

(10) Patent No.: US 10,925,177 B2
(45) Date of Patent: Feb. 16, 2021

(54) HEAT DISSIPATION IN AN ELECTRONIC CIRCUIT AND METHOD

(71) Applicant: COMET AG, Flamatt (CH)

(72) Inventor: Ulrich Hansen, Stolberg (DE)

(73) Assignee: Comet AG, Flamatt (CH)

(*) Notice: Subject to any disclaimer, the term of this patent is extended or adjusted under 35 U.S.C. 154(b) by 0 days.

(21) Appl. No.: 16/543,722

(22) Filed: Aug. 19, 2019

(65) Prior Publication Data

US 2020/0060035 A1 Feb. 20, 2020

(30) Foreign Application Priority Data

Aug. 20, 2018 (GB) .................................. 1813550.9

(51) Int. Cl.
| | | |
|---|---|---|
| H05K 7/20 | (2006.01) |
| H01F 27/00 | (2006.01) |
| H05K 5/06 | (2006.01) |
| H01F 27/02 | (2006.01) |
| H05K 5/00 | (2006.01) |

(52) U.S. Cl.
CPC ........... *H05K 5/064* (2013.01); *H01F 27/022* (2013.01); *H05K 5/0091* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 6,313,991 B1 | 11/2001 | Nagashima et al. | |
| 8,467,188 B2* | 6/2013 | Hsieh ................. | H05K 7/20927 |
| | | | 174/548 |
| 8,913,383 B1* | 12/2014 | Goldsmith ......... | H05K 7/20236 |
| | | | 257/714 |
| 9,336,939 B2* | 5/2016 | Steiger ................... | H01F 27/002 |
| 9,681,565 B2* | 6/2017 | Escamilla ............. | H05K 5/065 |
| 10,028,409 B1* | 7/2018 | Metzler .................. | H05K 7/203 |
| 2011/0304228 A1 | 12/2011 | Bradfield | |
| 2016/0285354 A1* | 9/2016 | Handy ................... | H01F 27/022 |
| 2017/0338025 A1 | 11/2017 | Benzerouk | |
| 2019/0263280 A1* | 8/2019 | Tang ................... | H05K 7/20272 |

FOREIGN PATENT DOCUMENTS

| | | |
|---|---|---|
| CN | 202948816 U | 5/2013 |
| EP | 3373314 A1 | 9/2018 |

* cited by examiner

*Primary Examiner* — Courtney L Smith
(74) *Attorney, Agent, or Firm* — The Webb Law Firm

(57) ABSTRACT

An electronic circuitry module and a method of potting an electronic circuit are provided. The electronic circuit module includes at least one heat generating electronic component and is potted in a potting material. Additionally, a cooling circuit is potted in the potting material. The cooling circuit includes an inlet and an outlet for flow of cooling liquid therebetween.

18 Claims, 2 Drawing Sheets

HEAT DISSIPATION IN AN ELECTRONIC CIRCUIT AND METHOD

TECHNICAL FIELD

The present disclosure generally relates to an electronic circuitry module including a potted electronic circuit and methods for potting electronic circuits. The present disclosure more particularly relates to heat dissipating in potted electronic circuits and associated electronic circuit potting methods.

BACKGROUND

In electronics, potting is a process of filling a complete electronic assembly with a solid or gelatinous compound for resistance to shock and vibration, and for exclusion of moisture and corrosive agents.

In some potting processes, an electronic assembly is placed inside a mold which is then filled with an electrically insulating liquid compound that hardens, permanently protecting the assembly. In some instances, the mold is part of the finished article and can provide shielding or heat dissipating functions in addition to acting as a mold.

Some potting materials have a relatively high thermal transfer coefficient to enhance cooling of the electronic assembly. Some electronic assemblies such as high power and high frequency assemblies could benefit from enhanced cooling in order to protect the electronic components.

Accordingly, it is desirable to provide an electronic circuitry module having a potted electronic circuit with enhanced cooling characteristics. A method of potting an electronic circuit so as to provide such an electronic circuitry module would also be desirable. In addition, it is desirable to protect electronic components of the electronic circuit from failure due to electrical breakdown and mechanical failure whilst maintaining electrical efficiency of the electronic circuit. Furthermore, other desirable features and characteristics of the present invention will become apparent from the subsequent detailed description of the invention and the appended claims, taken in conjunction with the accompanying drawings and the background of the invention.

SUMMARY

In one aspect, an electronic circuitry module is provided. The electronic circuitry model includes an electronic circuit. The electronic circuit includes a heat generating electronic component. The electronic circuit potted in a potting material. A cooling circuit is potted in the potting material. The cooling circuit includes an inlet and an outlet for flow of cooling liquid therebetween.

In embodiments, the cooling circuit includes at least one loop. However, straight cooling circuits are also envisaged.

In embodiments, the cooling circuit includes a cooling tube. The cooling tube extends in a zig-zag or serpentine fashion in some embodiments, in a straight fashion in other embodiments and includes at least one loop in yet further embodiments.

In embodiments, the heat generating component includes a transformer or an inductor. In embodiments, the heat generating component includes a planar transformer or inductor and/or a toroidal inductor or transformer. In embodiments, the heat generating component includes a ferrite transformer. In embodiments, the heat generating component includes a power transformer. In embodiments, the heat generating component includes a semiconductor and/or one or more capacitors.

In embodiments, the electronic circuit is a radiofrequency electronic circuit. In embodiments, the electronic circuit is a power electronic circuit.

In embodiments, the electronic circuit has a power rating of 100 Watt or more.

In embodiments, the electronic circuit includes a printed circuit board having one or more planar windings disposed thereon and associated with a ferrite core. In embodiments, the printed circuit board includes primary and secondary planar windings to provide, with the ferrite core, a planar power transformer. The potting material encapsulates spaces between the one or more planar windings and the ferrite core.

In embodiments, the electronic circuit includes first and second printed circuit boards that are stacked with respect to each other and occupy different levels. The potting material fills the space between the first and second printed circuit boards.

In embodiments, the electronic circuit includes one or more toroidal electronic components including spiral windings wrapped about a toroidal ferrite core. In embodiments, the electronic circuit includes one or more inductors. In embodiments, the one or more inductors include air wound inductors.

In embodiments, the electronic circuitry module includes a housing that houses the electronic circuit, the cooling circuit and the potting material. In embodiments, the potting material is molded in the housing prior to curing so as to encapsulate the cooling circuit and the electronic circuit.

In embodiments, the housing includes an inlet connector for connecting a cooling liquid source to the inlet of the cooling circuit and an outlet connector for connecting a cooling liquid drain to the outlet of the cooling circuit, wherein the inlet connector and the outlet connector are disposed for connection from the outside of the housing. In embodiments, the cooling liquid is communicated through a wall of the housing via the inlet and outlet connectors.

In embodiments, the housing includes electrical contacts for electrically connecting power and/or control signals to the electronic circuit that are arranged for connection from outside of the housing. In embodiments, the power and/or control signals are communicated through a wall of the housing via the electrical contacts.

In embodiments, the potting material has a thermal conductivity of at least 0.3 watt per meter-kelvin, W/mK, 0.4, 0.5, 0.6, 0.7, 0.8, 0.9 or 1.0 W/mK (using test method DIN EN ISO 220007-2)

In embodiments, the potting material has a Shore Hardness A in the range of 30 to 80 or 40 to 70 or 50 to 60 (using test method DIN 53505).

In embodiments, the potting material is a silicone-based resin.

In another aspect, a method of potting an electronic circuit is provided. The method includes placing an electronic circuit in a mold. The electronic circuit includes at a heat generating electronic component. The method includes placing a cooling circuit in the mold. The cooling circuit includes an inlet and an outlet for flow of cooling liquid therebetween. The method includes molding uncured potting material around the electronic circuit and the cooling circuit so as to encapsulate the electronic circuit and the cooling circuit. The method includes allowing the potting material to cure.

Features of the electronic circuitry module are applicable to the method. Likewise, features resulting from the potting method are applicable to the electronic circuitry module.

In embodiments, the molding step is performed in a vacuum.

In embodiments, the mold is a housing for the electronic circuit.

In embodiments, the housing includes contacts arranged on an outside thereof allowing electronic connection to the electronic circuit.

In embodiments, the housing includes an inlet connector for connecting a cooling liquid source to the inlet of the cooling circuit and an outlet connector for connecting a cooling liquid drain to the outlet of the cooling circuit. The inlet connector and the outlet connector are disposed on the outside of the housing.

In embodiments, the potting material has a thermal conductivity of at least 0.3 watt per meter-kelvin, W/mK.

In embodiments, the potting material is a silicone-based resin.

In embodiments, the electronic circuit comprises a power transformer.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
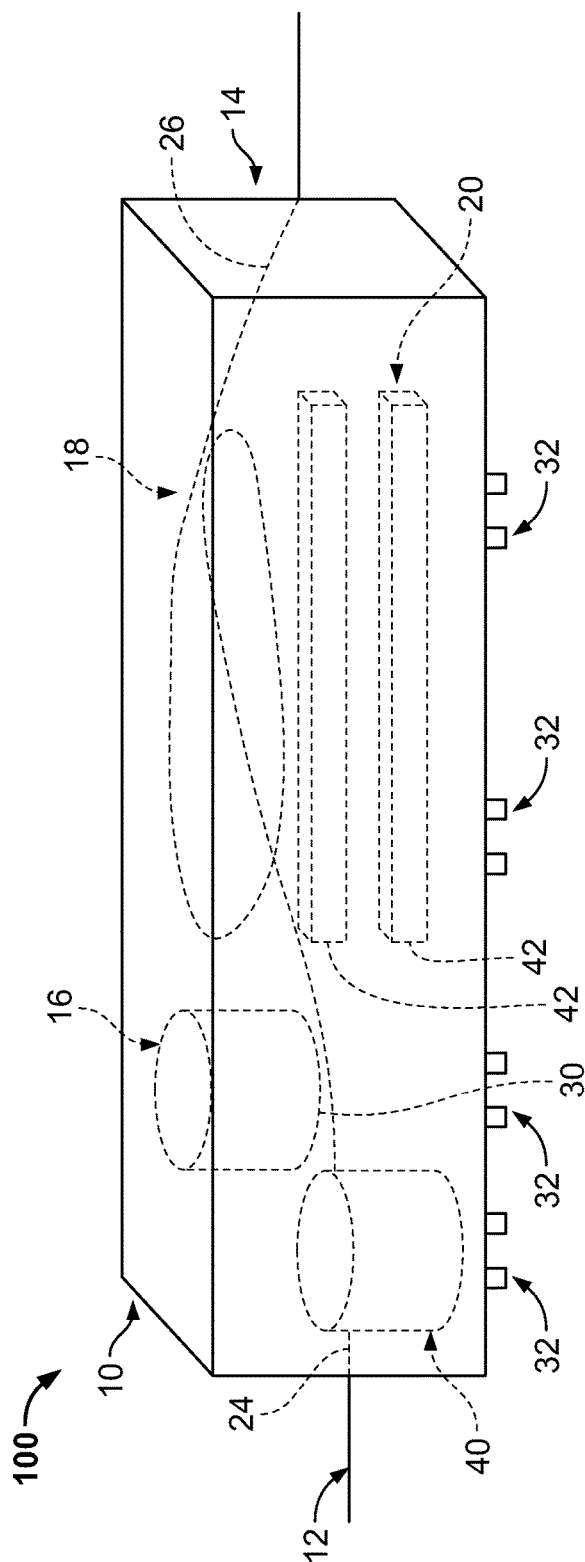
FIG. 1 is a schematic diagram of an electronic circuitry module in perspective view, in accordance with various embodiments.

FIG. 1 is a perspective view of an electronic circuitry module 8, in accordance with an exemplary embodiment. The electronic circuitry module 8 includes a housing 10 that houses one or more electronic circuits 40. The housing 10 further houses a cooling circuit 18. The one or more electronic circuits 40 and the cooling circuit 18 are potted in the housing 10 by a potting material 22 (see FIG. 2). In use, heat generated by electronic components of the one or more electronic circuits 40 is dissipated to the potting material 22 and is, in turn, dissipated to liquid flowing through the cooling circuit 18 and thus removed from the electronic circuitry module 8. The one or more electronic circuits 40 are kept cool, thereby avoiding failures and degraded performance associated with overheating.

In exemplary embodiments, the one or more electronic circuits 40 includes a planar power transformer 20. In an embodiment, the planar power transformer 20 includes a primary winding layer, a secondary winding layer and a ferrite core. The primary winding layer and the secondary winding layer are disposed on one or more printed circuit boards 42 (see FIG. 2). In examples, the primary winding layer and the second winding layer include flat copper (or other conductive material) windings that are formed as layers adhered to the one or more printed circuit boards 42 or they are etched or printed thereon. The potting material 22 encapsulates the one or more printed circuit boards 42, connections thereto and fills spaces between the one or more printed circuit boards 42 and the ferrite core. In some embodiments, the planar power transformer 20 includes first and second printed circuit boards respectively including the primary and second windings. The first and second printed circuit boards 42 are stacked and occupy different levels. The potting material 22 fills the vertical (in the stacking direction) space between the first and second printed circuit boards 42.

In various embodiments, the one or more electronic circuits 40 include a toroidal power transformer 16 including a primary winding and a second winding wrapped in a spiral fashion about a toroid shaped ferrite core. The potting material encapsulates the primary and secondary windings of the toroidal power transformer 16 including being disposed between turns thereof and being in contract with the toroid shaped ferrite core. In embodiments, the one or more electronic circuits 40 include both the toroidal power transformer 16 and the planar power transformer 20. In this way, the housing 10 includes more than one high heat generating electronic component to allow effective thermal insulation of these components in a modular fashion as well as inhibiting undesirable electrical discharge (i.e. arcs). In embodiments, the potting material 22 extends between the toroidal power transformer 16 and the planar power transformer 20 to fill all open spaces in the housing 10.

Figure 2:
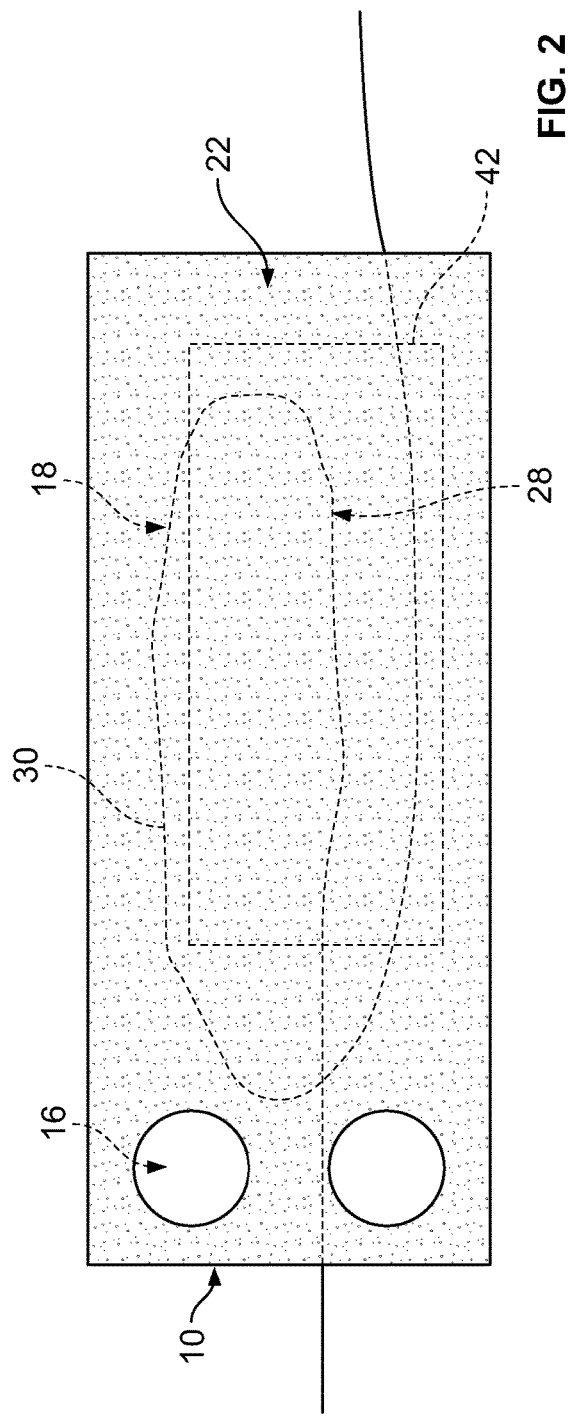
FIG. 2 is a schematic diagram of the electronic circuitry module of FIG. 1 in plan view, in accordance with various embodiments.

Although the embodiment of FIGS. 1 and 2 is discussed with respect to the one or more electronic circuits 40 including toroidal and planar power transformers 16, 20, other types of power transformers could be included additionally or alternatively. In fact, the one or more electronic circuits 40 could include heat generating electronic components other than power transformers that are subject to failure or degraded performance without effective cooling as provided by the potting material 22 and the cooling circuit 18. For example, the one or more electronic circuits 40 could include at least one inductor, at least one resistor, at least one capacitor and/or at least one resistor. In embodiments, the one or more electronic circuits 40 is adapted for connection to, or is connected to output, radiofrequency power and/or power of 100 Watt or greater. For example, the one or more electronic circuits 40 is connectable to a radiofrequency generator or forms part of a radiofrequency generator. Such a radiofrequency generator is configured to output powers of at least 100 Watt, 500 Watt or 1 kilowatt, in accordance with an exemplary embodiment. In some embodiments, the one or more electronic circuits 40 is included in a plasma generation system. Such embodiments are particularly susceptible to component failure or degraded performance due to overheating and thus are well served by an effective heat dissipating arrangement as shown.

In embodiments, the cooling circuit 18 includes at least one loop 28 to increase the cooling surface area. The cooling circuit 18 has, in some examples, a biased spatial distribution so as to be concentrated in areas co-located with heat generating components of the one or more electronic circuits 40 such as the power transformers 16, 20 to increase effectiveness of thermal transfer. In embodiments, the cooling circuit 18 includes a cooling tube 30 extending from an inlet 24 of the cooling circuit 18 where cooling liquid enters the housing 10 to an outlet 26 of the cooling circuit 18 where cooling liquid exits the housing 10. The cooling tube 30 is, in an embodiment, made from a material having a high thermal conductivity (such as at least 10, at least 100 watts per meter-kelvin W/(m·K)). For example, the cooling tube 30 is made of metal such as copper or ceramic. A cross-section of the cooling tube 30 is circular or substantially circular in some embodiments, although other cross-sections are envisaged such as flat cross-sections (like ribbon), oval, planar, etc. In the exemplary embodiment, the cooling tube is disposed in a stacked way relative to the one or more electronic circuits 40. However, an entwined or coiled relationship between heat generating electronic components of the one or more electronic circuits 40 is envisaged.

In accordance with an embodiment, the cooling circuit 18 forms part of an open-circuit liquid cycle or a closed-circuit liquid cycle. In an open circuit liquid cycle, cooling liquid is not recycled. In a closed-circuit liquid cycle, cooling liquid is recycled from the outlet 26 to the inlet 24 via a liquid cooling device. In various embodiments, a pump (not shown) is included to route the liquid through the cooling circuit 18. In one example, one or more temperature sensors are included in the cooling circuit to measure a temperature of the cooling liquid. In such an example embodiment, a controller maintains a temperature control feedback in association with a cooling device and/or a pump to maintain target cooling liquid temperature.

In accordance with some embodiments, the housing 10 includes an inlet connector 12 and an outlet connector 14 in communication with inlet and outlet portions of the cooling circuit 18. The inlet connector 12 allows connection to a liquid source. The outlet connector 14 allows connection to a liquid drain. Liquid is provided to the inlet connector and passes through the cooling circuit to the outlet connector 14. Any suitable liquid can be used such as water for convenience of supply or oil. The cooling circuit 18 is in intimate contact with the potting material 22, which is, in turn, in intimate contact with the one or more electronic circuits 40, thereby forming an effective heat exchange arrangement. Communication of liquid from the inlet connector 12 to the cooling circuit 18 and from the cooling circuit 18 to the outlet connector 14 passes through walls of the housing 10.

In the exemplary embodiment of FIG. 1, the housing 10 includes a base plate (not shown) upon which the one or more electronic circuits 40 is disposed and secured. In some embodiments, the base plate is constituted by at least one of the one or more printed circuit boards 42. One or more sidewalls (not shown) of the housing 10 extend around the base plate to form an enclosure. A releasably securable lid is configured to mate with the one or more sidewalls to allow opening and closing of the housing 10. The releasably securable lid is configured for sealed mating with the one or more sidewalls in some embodiments so that the housing 10 is a sealed enclosure when the lid is closed. Releasable securement can be effected in a number of ways such as screws, latches, resilient mating components, etc. In embodiments, the housing 10 includes contacts 32 on an outside thereof for electrically connecting external circuits to communicate power and/or control signals to the one or more electronic circuits 40, e.g. the power transformers 16, 20. Electrical paths, e.g. wires, vias or circuit traces, provide electrical connection between the contacts 32 on the outside of the housing 10 and the one or more electronic circuits 40. In the exemplary embodiment, the contacts 32 are disposed on the outside of the base plate. In other embodiments, the contacts are located on the outside of the releasably securable lid. The releasably securable lid is a printed circuit board in some examples.

In embodiments, the potting material 22 is a cured silicone-based resin. Other potting materials are useful in other embodiments such as polyurethane and epoxy-based resins. In exemplary embodiments, the potting material 22 has a thermal conductivity of at least 0.3 W/mK. Additionally, the potting material 22 has Shore Hardness as characterized hereinbefore. One example suitable material is a two component silicone elastomer resin available from acc having a thermal conductivity of 1.2 W/mK.

Figure 3:
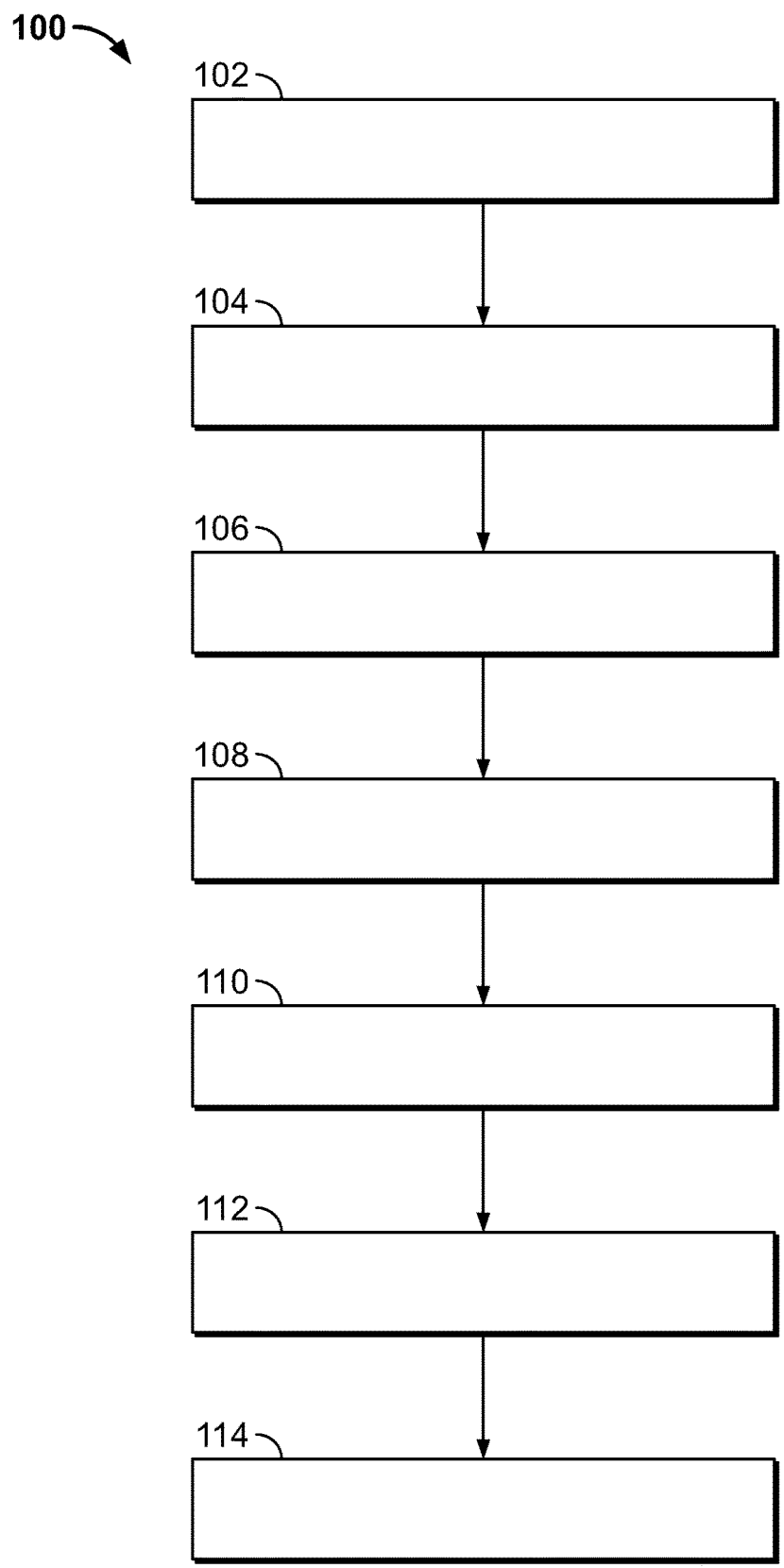
FIG. 3 is a flow chart of a method of potting an electronic circuit, in accordance with various embodiments.

An exemplary method 100 of potting the one or more electronic circuits 40 is described in the flow chart of FIG. 3. At 102, the exemplary method includes providing the housing 10. At 104, the exemplary method includes providing the one or more electronic circuits 40. The one or more electronic circuits 40 including at least one power transformer 16, 20 in some embodiments, as described heretofore. In one embodiment, a printed circuit board 42 of the one or more electronic circuits 40 constitutes a base plate of the housing 10. In the present example, the housing 10 provides a mold for the potting material 22. At 106, the exemplary method includes providing the cooling circuit 40. In an example, providing the cooling circuit 40 constitutes providing the cooling tube 30.

In accordance with various embodiments, the one or more electronic circuits 40 is placed in the housing 10 at 108. At 110, the cooling circuit 40 is arranged in the housing 10 above the one or more electronic circuits 40 by, for example, looping the cooling tube 30 to provide the loop 28. The cooling tube 30 is extended through a sidewall of the housing 10 to provide the inlet and outlet connectors 12, 14 in some embodiments or the cooling tube 30 is connected at opposite ends to the inlet and outlet connectors 12, 14 in other embodiments.

In the exemplary method, at 112, uncured potting material is molded around the one or more electronic circuits 40 and the cooling circuit 18. In some embodiments, step 112 is performed when the lid of the housing 10 is closed and possibly sealed. A potting material injection port is included in the housing 10 to allow introduction of the potting material. In other embodiments, the potting material 22 is poured or otherwise disposed over the one or more electronic circuits. The potting material 22 conforms to the housing 10, which forms the mold, and fills all spaces in the one or more electronic circuits 40 and the cooling circuit 18 and any spaces therebetween. That is, the potting material 22 submerges the cooling circuit 18 and the one or more electronic circuits 40. In some embodiments, step 112 is performed with the housing 22 and the housed cooling circuit 18 and one or more electronic circuits 40 under vacuum pressure (e.g. in a vacuum enclosure).

In step 114, the potting material 22 is allowed to cure. Curing takes places at room temperature in some embodiments. In other embodiments, ultraviolet and/or visible light curing is used. In some embodiments, curing is accelerated by heating (e.g. by placing the electronic circuitry module 8 in an oven).

In one example use, at least one external circuit providing power and/or control signals to the one or more electronic circuits 40 is connected to the contacts 32. In this particular embodiment, power and/or control signals are provided for power transformation by the planar transformer 20 and/or the toroidal transformer 16. A liquid source is connected to the inlet connector 12 and a drain is connected to the outlet connector 14. The at least one external circuit is configured to run the power transformers 16, 20 via the contacts 32 so as to transform power, which transformed power is returned to the at least one external circuit. The cooling circuit 18 is configured to flow liquid from the inlet connector 12 to the outlet connector 14 when the power transformers 16, 20 are being operated. The power transformers 16, 20 generate heat, which is transferred to the potting material 22 and thus to the liquid flowing through the cooling circuit 18 and out of the electronic circuitry module 8. In this way, the potting material serves as a low loss factor, electrically insulative heat exchange medium between the one or more electronic circuits 40 and the cooling circuit 18. In addition to reducing electrical discharge from the one or more electronic circuits 40, the potting material 22 facilitates effective cooling of the one or more electronic circuits 40 to ensure proper operation and longevity of components.

While at least one exemplary aspect has been presented in the foregoing detailed description of the invention, it should be appreciated that a vast number of variations exist. It should also be appreciated that the exemplary aspect or exemplary aspects are only examples, and are not intended to limit the scope, applicability, or configuration of the invention in any way. Rather, the foregoing detailed description will provide those skilled in the art with a convenient road map for implementing an exemplary aspect of the invention. It being understood that various changes may be made in the function and arrangement of elements described in an exemplary aspect without departing from the scope of the invention as set forth in the appended claims.

What is claimed is:

1. An electronic circuitry module, comprising:
a housing comprising a base plate and one or more sidewalls connected to and extending around the base plate to form an enclosure;
at least one electronic circuit comprising at least one heat generating electronic component disposed within the enclosure and mounted on the base plate, the at least one heat generating component comprising at least one power transformer;
a cooling circuit disposed within the enclosure and including an inlet and an outlet for flow of cooling liquid therebetween; and
a potting material that conforms to the housing and substantially fills the enclosure to submerse the at least one electronic circuit and the cooling circuit,
wherein the at least one electronic circuit includes a first printed circuit board and a second printed circuit board that are stacked with respect to each other and occupy different levels, and wherein the potting material fills a space between the first printed circuit board and the second printed circuit board.

2. The electronic circuitry module of claim 1, wherein the cooling circuit comprises at least one loop.

3. The electronic circuitry module of claim 1, wherein the cooling circuit comprises a cooling tube.

4. The electronic circuitry module of claim 1, wherein the at least one heat generating component comprises an inductor.

5. The electronic circuitry module of claim 4, wherein the at least one heat generating component comprises at least one of a planar inductor, an air wound inductor, and a toroidal inductor.

6. The electronic circuitry module of claim 1, wherein the at least one power transformer is a planar power transformer.

7. The electronic circuitry module of claim 1, wherein the at least one electronic circuit is a radiofrequency electronic circuit having a power rating of 100 Watt or more.

8. The electronic circuitry module of claim 1, wherein the housing includes an inlet connector for connecting a cooling liquid source to the inlet of the cooling circuit and an outlet connector, wherein the inlet connector and the outlet connector are disposed for connection from the outside of the housing.

9. The electronic circuitry module of claim 1, wherein the housing includes electrical contacts for electrically connecting power and/or control signals to the at least one electronic circuit that are arranged for connection from outside of the housing.

10. The electronic circuitry module of claim 1, wherein the potting material has a thermal conductivity of at least 0.3 watt per meter-kelvin, W/mK.

11. The electronic circuitry module of claim 1, wherein the potting material is a silicone-based resin.

12. A method of potting an electronic circuit, the method comprising:
placing at least one electronic circuit comprising at least one heat generating electronic component in a housing for the at least one electronic circuit, wherein the at least one heat generating component comprises a power transformer and the housing comprises a base plate and one or more sidewalls connected to and extending around the base plate to form an enclosure, the at least one electronic circuit mounted on the base plate and including a first printed circuit board and a second printed circuit board that are stacked with respect to each other and occupy different levels;
placing a cooling circuit in the enclosure, the cooling circuit including an inlet and an outlet for flow of cooling liquid therebetween;
molding uncured potting material around the at least one electronic circuit and the cooling circuit so as to encapsulate the at least one electronic circuit and the cooling circuit, whereby the potting material conforms to the housing and substantially fills the enclosure to submerse the at least one electronic circuit and the cooling circuit, and wherein the potting material fills a space between the first printed circuit board and the second printed circuit board; and
allowing the potting material to cure.

13. The method of claim 12, wherein the molding step is performed in a vacuum.

14. The method of claim 12, wherein the housing includes contacts arranged on an outside thereof allowing electronic connection to the at least one electronic circuit.

15. The method of claim 12, wherein the housing includes an inlet connector for connecting a cooling liquid source to the inlet of the cooling circuit and an outlet connector for connecting a cooling liquid drain to the outlet of the cooling circuit, wherein the inlet connector and the outlet connector are disposed on the outside of the housing.

16. The method of claim 12, wherein the potting material has a thermal conductivity of at least 0.3 watt per meter-kelvin, W/mK.

17. The method of claim 12, wherein the potting material is at least one of a silicone-based resin, a polyurethane-based resin, and an Epoxy-based resin.

18. The method of claim 12, wherein the at least one electronic circuit comprises a planar power transformer.

* * * * *